US011442369B2

(12) United States Patent
Huang et al.

(10) Patent No.: US 11,442,369 B2
(45) Date of Patent: Sep. 13, 2022

(54) OBJECT STAGE BEARING FOR LITHOGRAPHIC APPARATUS

(71) Applicant: ASML Netherlands B.V., Veldhoven (NL)

(72) Inventors: Yang-Shan Huang, Veldhoven (NL); Pieter Cornelis Johan De Jager, Wierden (NL); Rob Reilink, Enschede (NL); Christiaan Louis Valentin, Eindhoven (NL); Jasper Leonardus Johannes Scholten, Borne (NL); Antonie Hendrik Verweij, Dussen (NL); Edwin Van Horne, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/763,487

(22) PCT Filed: Nov. 7, 2018

(86) PCT No.: PCT/EP2018/080433
§ 371 (c)(1),
(2) Date: May 12, 2020

(87) PCT Pub. No.: WO2019/096644
PCT Pub. Date: May 23, 2019

(65) Prior Publication Data
US 2020/0333717 A1 Oct. 22, 2020

Related U.S. Application Data

(60) Provisional application No. 62/585,767, filed on Nov. 14, 2017.

(51) Int. Cl.
G03F 7/20 (2006.01)

(52) U.S. Cl.
CPC ...... *G03F 7/70716* (2013.01); *G03F 7/70816* (2013.01); *G03F 7/70908* (2013.01)

(58) Field of Classification Search
CPC ............ G03F 7/70716; G03F 7/70908; G03F 7/70816
See application file for complete search history.

(56) References Cited

U.S. PATENT DOCUMENTS 4,749,283 A * 6/1988 Yokomatsu ........... F16C 29/025
384/12
6,603,130 B1 * 8/2003 Bisschops ........... G03F 7/70816
250/492.1

(Continued)

FOREIGN PATENT DOCUMENTS

EP     1 211 560 A1    6/2002

OTHER PUBLICATIONS

International Search Report and Written Opinion of the International Searching Authority directed to International Patent Application No. PCT/EP2018/080433, dated Mar. 4, 2019; 8 pages.

(Continued)

*Primary Examiner* — Steven Whitesell Gordon
(74) *Attorney, Agent, or Firm* — Sterne, Kessler, Goldstein & Fox P.L.L.C.

(57) ABSTRACT

An object stage bearing system can include an object stage, a hollow shaft coupled to the object stage, and an in-vacuum gas bearing assembly coupled to the hollow shaft and the object stage. The in-vacuum gas bearing assembly can include a gas bearing, a scavenging groove, and a vacuum groove. The gas bearing is disposed along an inner wall of the in-vacuum gas bearing assembly and along an external wall of the hollow shaft. The scavenging groove is disposed along the inner wall such that the scavenging groove is isolated from the gas bearing. The vacuum groove is dis- (Continued)

posed along the inner wall such that the vacuum groove is isolated from the scavenging groove and the gas bearing.

20 Claims, 12 Drawing Sheets

(56) References Cited

U.S. PATENT DOCUMENTS

| | | | | |
|---|---|---|---|---|
| 6,915,179 | B2* | 7/2005 | Emoto | B82Y 10/00 |
| | | | | 700/121 |
| 2002/0021425 | A1* | 2/2002 | Janssen | F16F 15/0275 |
| | | | | 355/53 |
| 2002/0034345 | A1* | 3/2002 | Tsuda | G03F 7/70816 |
| | | | | 384/12 |
| 2002/0070699 | A1* | 6/2002 | Tanaka | G03F 7/70725 |
| | | | | 318/687 |
| 2002/0180946 | A1 | 12/2002 | Bisschops et al. | |
| 2003/0002756 | A1* | 1/2003 | Shinohara | F16C 32/0614 |
| | | | | 384/12 |
| 2003/0075871 | A1* | 4/2003 | Shinozaki | F16C 29/025 |
| | | | | 277/431 |
| 2003/0094059 | A1 | 5/2003 | Higuchi et al. | |
| 2005/0189901 | A1 | 9/2005 | Tanaka | |
| 2006/0060259 | A1* | 3/2006 | Devitt | H01L 21/68714 |
| | | | | 141/65 |
| 2009/0255447 | A1* | 10/2009 | Schubert | G03F 7/70991 |
| | | | | 108/143 |
| 2011/0032505 | A1 | 2/2011 | Lansbergen et al. | |
| 2011/0204255 | A1 | 8/2011 | Ooae et al. | |

OTHER PUBLICATIONS

International Preliminary Report on Patentability directed to International Patent Application No. PCT/EP2018/080433, dated May 19, 2020; 6 pages.

* cited by examiner

OBJECT STAGE BEARING FOR LITHOGRAPHIC APPARATUS

CROSS-REFERENCE TO RELATED APPLICATIONS

This application claims priority of U.S. Provisional Patent Application No. 62/585,767, which was filed on Nov. 14, 2017, and which is incorporated herein in its entirety by reference.

FIELD

The present disclosure relates to particle suppression using, for example, in-vacuum air bearings in, for example, lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. The patterning device can be held in a vacuum environment. Within this vacuum environment, there can be contaminant particle sources, for example, cables or cable and hose carrier, which can generate contaminant particles. If these contaminant particles reach the patterning device and/or regions near the patterning device, defects in the formed image may occur.

One particle generation source is a cable slab, which are needed for object stage applications and supply the necessary pressure, cooling, and power via cables and hoses (e.g., vacuum, ambient gas, pressurized gas, water, electrical power, electrical signals, etc.). Air bearings and magnetic levitation have been used to control an object stage. However, magnetic levitation has a wide air gap of approximately 2 mm, and during an emergency shutdown the object stage bearing will land (i.e., fall) approximately 2 mm than can cause damage to the system and sensors.

Accordingly, there is a need in a lithographic apparatus to reduce particle contamination and avoid large air gaps, which can damage the system during a rapid shutdown, while maintaining precise linear control of the object stage.

SUMMARY

In some embodiments, an object stage bearing system includes an object stage, a hollow shaft coupled to the object stage, and an in-vacuum gas bearing assembly coupled to the hollow shaft and the object stage. In some embodiments, the in-vacuum gas bearing assembly includes a gas bearing, a scavenging groove, and a vacuum groove. In some embodiments, the gas bearing is disposed along an inner wall of the in-vacuum gas bearing assembly and disposed along an external wall of the hollow shaft. In some embodiments, the scavenging groove is disposed along the inner wall such that the scavenging groove is isolated from the gas bearing. In some embodiments, the vacuum groove is disposed along the inner wall such that the vacuum groove is isolated from the scavenging groove and the gas bearing.

In some embodiments, an object stage bearing system includes a hollow shaft and an in-vacuum gas bearing assembly coupled to the hollow shaft. In some embodiments, the in-vacuum gas bearing assembly includes a gas bearing, a scavenging groove, and a vacuum groove. In some embodiments, the gas bearing is disposed along an inner wall of the in-vacuum gas bearing assembly and disposed along an external wall of the hollow shaft. In some embodiments, the scavenging groove is disposed along the inner wall such that the scavenging groove is isolated from the gas bearing. In some embodiments, the vacuum groove is disposed along the inner wall such that the vacuum groove is isolated from the scavenging groove and the gas bearing.

In some embodiments, an in-vacuum gas bearing assembly includes a gas bearing, a scavenging groove, and a vacuum groove. In some embodiments, the gas bearing is disposed along an inner wall of the in-vacuum gas bearing assembly and disposed along an external wall of the hollow shaft. In some embodiments, the scavenging groove is disposed along the inner wall such that the scavenging groove is isolated from the gas bearing. In some embodiments, the vacuum groove is disposed along the inner wall such that the vacuum groove is isolated from the scavenging groove and the gas bearing.

In some embodiments, the gas bearing is an air bearing. In some embodiments, the scavenging groove surrounds the gas bearing on one axial side. In some embodiments, the scavenging groove surrounds the gas bearing on both axial sides. In some embodiments, the vacuum groove surrounds the scavenging groove on one axial side.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the invention.

Figure 1A:
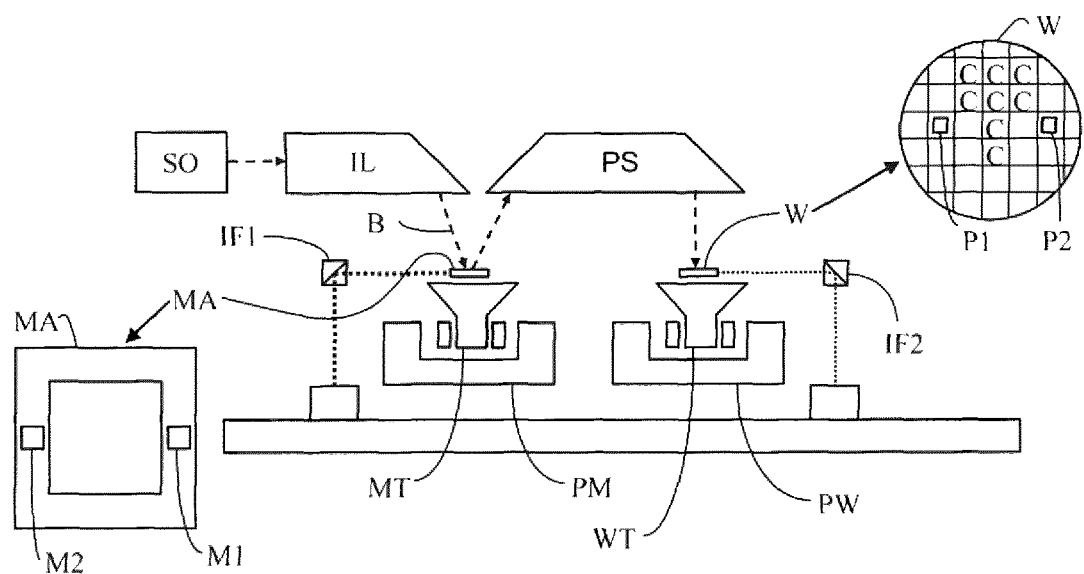
FIG. 1A is a schematic illustration of a reflective lithographic apparatus according to an embodiment of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," "exemplary," "example," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present disclosure may be implemented.

Figure 1B:
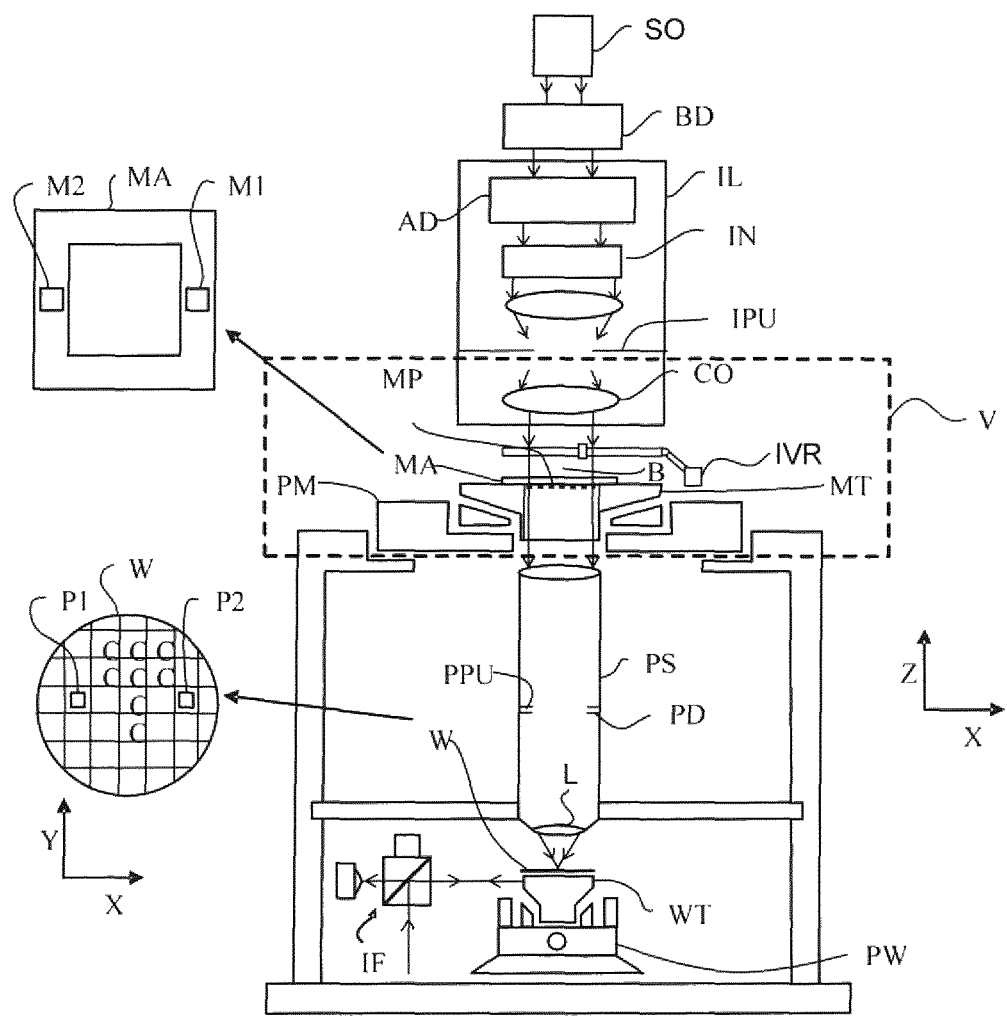
FIG. 1B is a schematic illustration of a transmissive lithographic apparatus according to an embodiment of the disclosure.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a reticle stage or a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, a reticle stage or mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, a reticle stage or mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the reticle stage or mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the reticle stage or mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Reticle stage or mask table MT and patterning device MA can be in a vacuum chamber, where an in-vacuum robot IVR can be used to move patterning devices such as a mask or a reticle in and out of vacuum chamber. Alternatively, when reticle stage or mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, reticle stage or mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, reticle stage or mask table) MT and the substrate table WT are scanned synchronously while a pattern imparted to the radiation beam B is projected onto a target portion C (i.e., a single dynamic exposure). The velocity and direction of the substrate table WT relative to the support structure (for example, reticle stage or mask table) MT can be determined by the (de-)magnification and image reversal characteristics of the projection system PS.

3. In another mode, the support structure (for example, reticle stage or mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
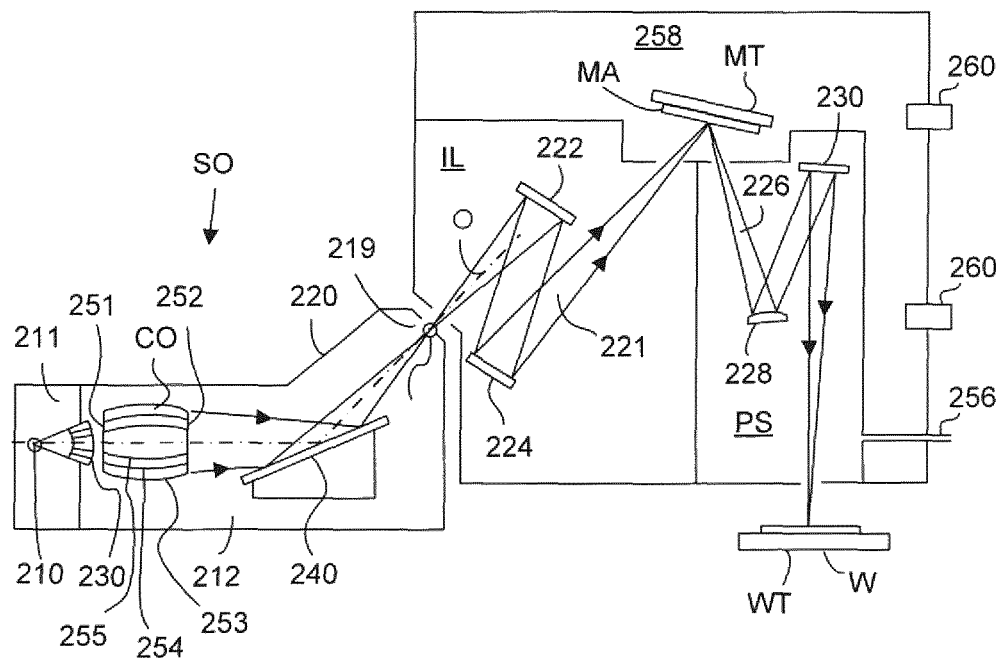
FIG. 2 is a more detailed schematic illustration of the reflective lithographic apparatus, according to an embodiment of the disclosure.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT. Support structure MT and patterning device MA can be contained in an environment 258 fluidly connect to one or more pumps 260 configured to create a vacuum pressure in environment 258.

More elements than shown may generally be present in illumination optics unit IL and projection system PS. The grating spectral filter 240 may optionally be present, depending upon the type of lithographic apparatus. Further, there may be more mirrors present than those shown in the FIGS., for example there may be 1-6 additional reflective elements present in the projection system PS than shown in FIG. 2. The housing(s) forming illumination optics unit IL and projection system PS can be fluidly coupled to one or more gas supplies 256 configured to inject gas therein to create a gas flow that protect the optical elements contained therein.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
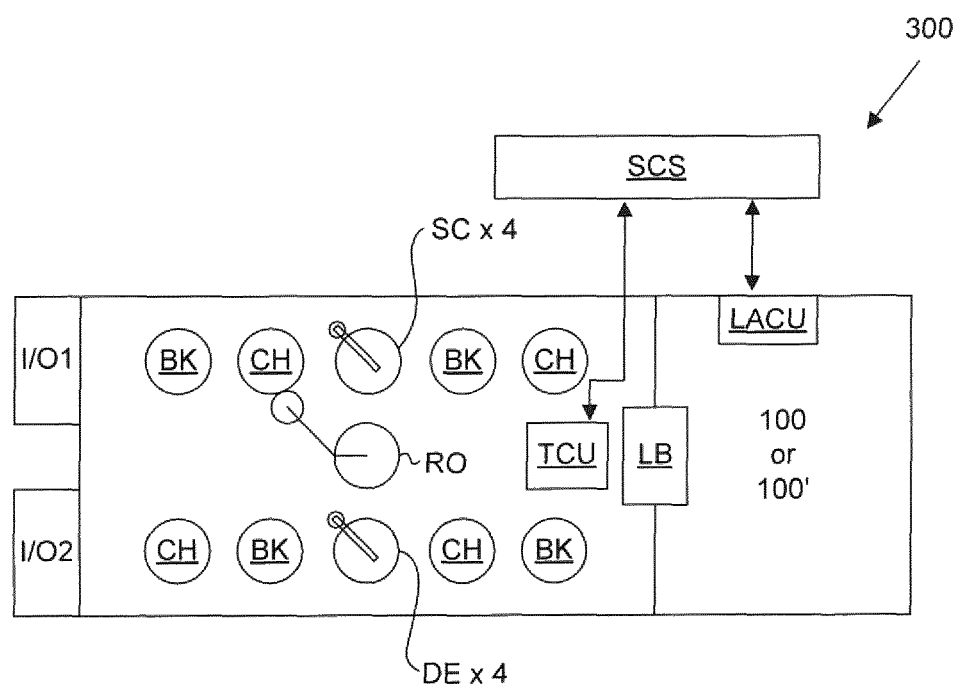
FIG. 3 is a schematic illustration of a lithographic cell, according to an embodiment of the disclosure.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The embodiments of this disclosure can be used with one or more apparatuses of FIGS. 1A, 1B, 2, and/or 3. For example, the embodiments of this disclosure can be applied to object stages, such as (a) reticle stage or mask table MT or (b) substrate table WT, that are configured to support an object, such as substrate W and patterning device MA.

Figure 4:
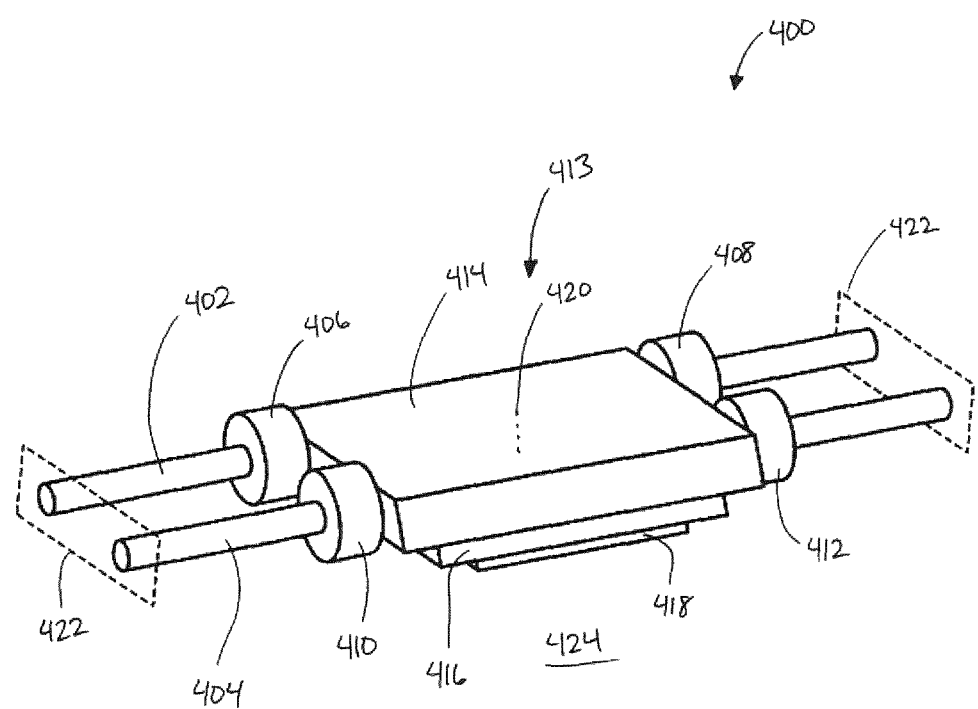
FIG. 4 schematically depicts an object stage bearing system, according to an embodiment.

FIG. 4 schematically depicts, in perspective view, one embodiment of an object stage bearing system 400. Object stage bearing system 400 is configured to support and, in some embodiments, move an object stage 413, which supports an exchangeable object 418, along first and second hollow shafts 402, 404 using a plurality of in-vacuum air bearing assemblies 406, 408, 410, 412 while suppressing particle contamination. In some embodiments, object stage 413 includes a first stage module 414 (for example, a long stroke (LS) module) and a second stage module 416 (for example, a short stroke (SS) module) movable relative to the first stage module 414. In some embodiments, exchangeable object 418 is a reticle.

Object stage 413 can define a stage chamber 420. Stage chamber 420 is configured to operate as a moving dirty vacuum chamber between in-vacuum air bearing assemblies 406, 408, 410, 412. Stage chamber 420 can house, for example, electrical and/or fluid cables and hoses. Further, stage chamber 420 is configured to operate as part of a vacuum channel, which is connected to in-vacuum air bearing assemblies 406, 408, 410, 412 and hollow shafts 402, 404. In some embodiments, hollow shafts 402, 404 can be cylindrical, and in-vacuum air bearing assemblies 406, 408, 410, 412 can be annular, as shown in FIG. 4. In some embodiments, hollow shafts 402, 404 and in-vacuum air bearing assemblies 406, 408, 410, 412 can be cylindrical, rectangular, elliptical, or any other sufficient cross-sectional shape to support first stage module 414 and reduce particle contamination. Hollow shafts 402, 404 support first stage module 414 and structurally connect first stage module 414 to walls 422, which define an outer chamber 424 containing object stage bearing system 400.

Although the below embodiments are discussed with respect to an object stage (such as a reticle stage or wafer stage), other moveable components sensitive to particle contamination, such as metrology systems, tubes, gas flow ducts, or boxes of gas ducts/pipes, can use object stage bearing system 400. The embodiments of this disclosure can also be applied to any particle sensitive apparatus to reduce the number of undesired contaminant particles.

Object stage bearing system 400 can be configured to suppress (i.e., eliminate or reduce) the amount of contamination particles entering outer chamber 424 and, thus, reaching exchangeable object 418. Sources of contamination can be located, for example, in one or more of stage chamber 420 and outer chamber 424. Or for example, sources of contamination can be located in illumination system IL or projection system PS (e.g., illumination system IL or projection system PS described above with reference to FIGS. 1A, 1B, and 2).

Figure 5:
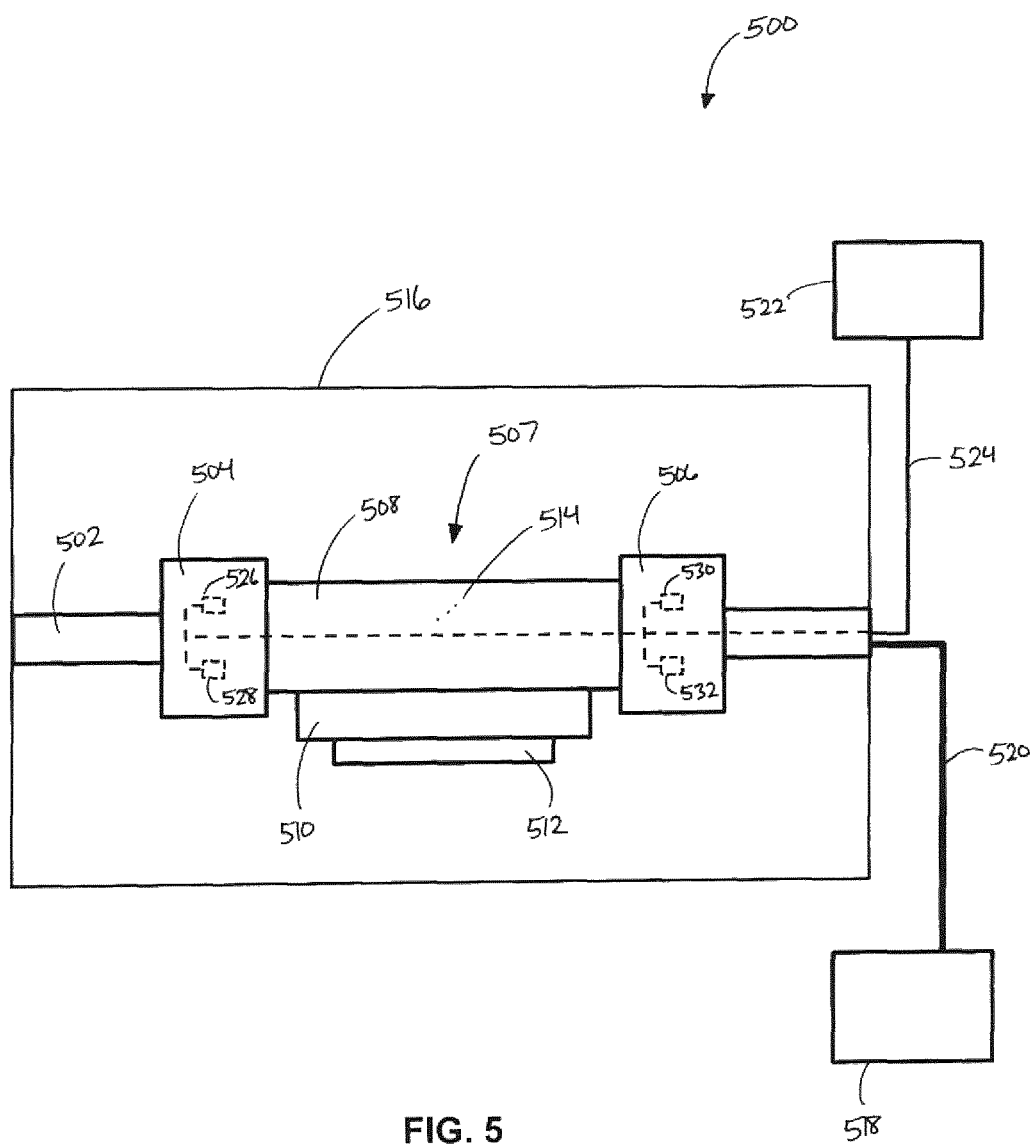
FIG. 5 schematically depicts a cross-section of an object stage bearing system having a supply line and a vacuum line, according to an embodiment.

FIG. 5 schematically depicts a cross-section of one embodiment of an object stage bearing system 500. Object stage bearing system 500 is configured to support and/or move an object stage 507 (including a first stage module 508, for example, a LS module, and a second stage module 510, for example, a SS module), which supports an exchangeable object 512, along at least one hollow shaft 502 using first and second in-vacuum air bearing assemblies 504, 506. Object stage bearing system 500 includes at least one maintenance supply 522, at least one maintenance supply line 524 (for example, electric cables and/or fluid hoses), at least one vacuum pump 518, and at least one vacuum pump line 520. Object stage bearing system 500 can be enclosed in an outer chamber 516 with at least one port at one end to allow maintenance supply line 524 and vacuum pump line 520 to couple with the interior channel defined by hollow shaft 502.

In some embodiments, as shown in FIG. 5, maintenance supply 522 and vacuum pump 518 are external to outer chamber 516. Maintenance supply 522 and maintenance supply line 524 are configured to supply one or more of an electrical cable(s) and fluid hose(s) needed for object stage applications (e.g., movement, calibration, feedback, control, etc.) and supply the necessary pressure, cooling, and/or power (e.g., vacuum, ambient gas, pressurized gas, water, electrical power, electrical signals, etc.). Maintenance supply line 524 can be configured to supply pressurized gas, for example, air to air bearings 526, 528 of a first in-vacuum air bearing assembly 504 and to air bearings 530, 532 of a second in-vacuum air bearing assembly 506. In some embodiments, the pressurized gas supplied by maintenance supply line 524 can be an inert gas (e.g., argon, nitrogen, helium) and/or a gas substantially purified of any contaminants.

First stage module 508 comprises stage chamber 514. Stage chamber 514 is configured to operate as a moving dirty vacuum chamber between first and second in-vacuum air bearing assemblies 504, 506. Stage chamber 514 can be held at a low pressure (e.g., vacuum) by being fluidly connected to vacuum pump 518 via vacuum line 520 and the channel defined by shaft 502. Stage chamber 514 can house, for example, cable and hose slabs represented by maintenance supply line 524. First in-vacuum air bearing assembly 504 includes air bearings 526, 528. Second in-vacuum air bearing assembly 506 includes air bearings 530, 532. In some embodiments, instead of two separate air bearings (for example, air bearings 526, 528) as shown in FIG. 5, the air bearing can be a single air that extends circumferentially around shaft 502. Maintenance supply line 524 supplies pressurized gas to each air bearing 526, 528, 530, 532 in order to raise the interior surface of first and second in-vacuum air bearing assemblies 504, 506 away from the exterior surface of hollow shaft 502, creating a small air gap.

The resulting air gap can be, for example, about 10 microns. The small air gap produced by pressurized first and second in-vacuum air bearing assemblies 504, 506 creates a surface averaging effect along hollow shaft 502 and allows first stage module 508 to stably move along hollow shaft 502. The pressurized gas can then be siphoned out and away from each air bearing 526, 528, 530, 532 by a lower pressure (e.g., vacuum) outlet of maintenance supply line 524 and/or vacuum pump line 520.

Holding stage chamber 514 at a low pressure (via coupling with vacuum pump 518) and siphoning out the pressurized gas introduced at air bearings 526, 528, 530, 532 can suppress the amount of contamination entering outer chamber 516, which in turn suppresses the amount of contamination reaching exchangeable object 512.

Figure 6:
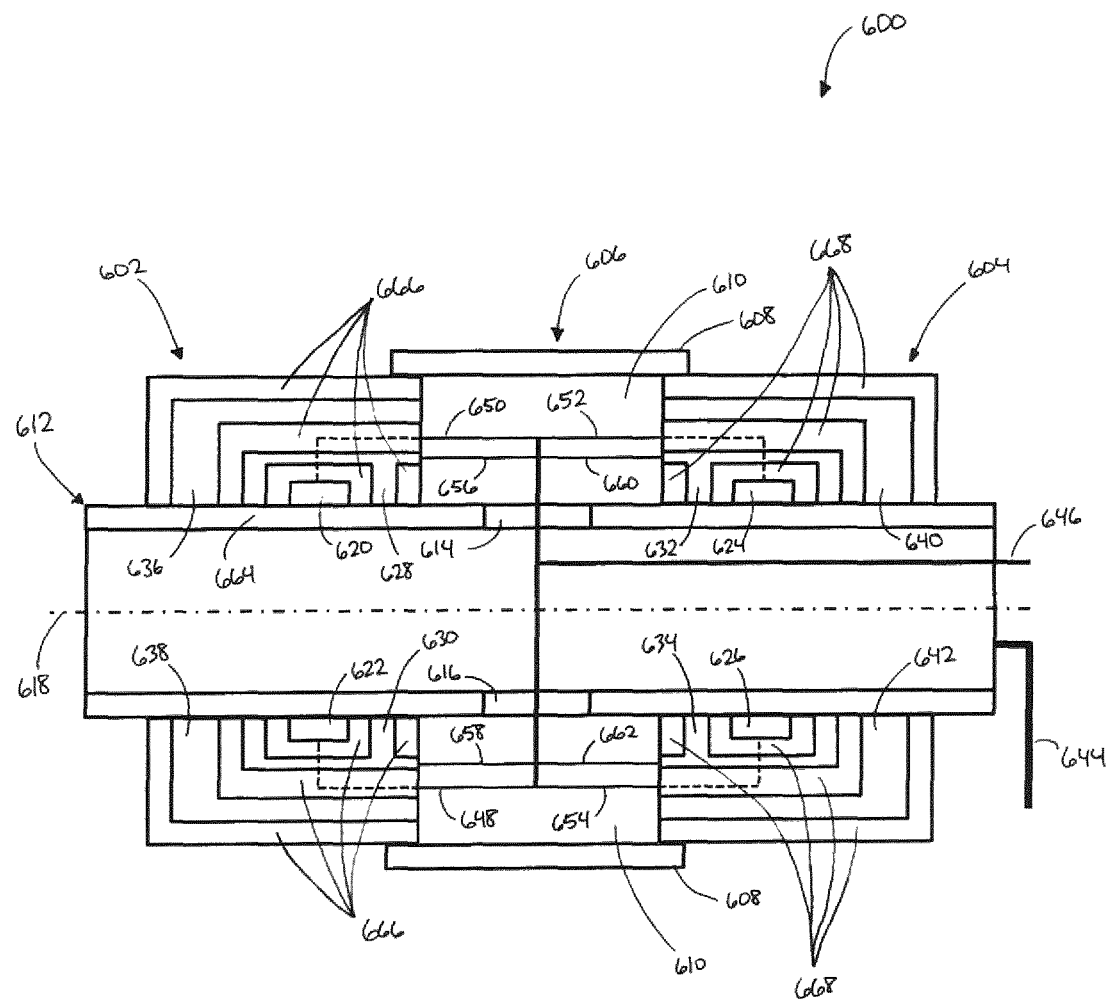
FIG. 6 schematically depicts a partial cross-section of an object stage bearing system with in-vacuum air bearings, according to an embodiment.

FIG. 6 schematically depicts a partial schematic cross-section of one embodiment of an object stage bearing system 600. Object stage bearing system 600 is configured to support and/or move an object stage 606 along a hollow shaft 612 via first and second in-vacuum air bearing assemblies 602, 604. Object stage bearing system 600 includes a maintenance supply line 646, for example, one or more electrical cables and/or hoses connected to a maintenance supply, and a vacuum pump line 644 connected to a vacuum pump.

Object stage 606 can define a stage chamber 610 fluidly connected to vacuum pump line 644. Stage chamber 610 is configured to operate as a moving dirty vacuum chamber between first and second in-vacuum air bearing assemblies 602, 604. Stage chamber 610 can house, for example, the one or more electrical cables and hoses represented by maintenance supply line 646. First in-vacuum air bearing assembly 602 comprises air bearings 620, 622 and second in-vacuum air bearing assembly 604 comprises air bearings 624, 626. Maintenance supply line 646 supplies pressurized gas to each air bearing 620, 622, 624, 626 in order to separate the interior surface of first and second in-vacuum air bearing assemblies 602, 604 from an exterior wall 664 of hollow shaft 612, thereby creating a small air gap, for example, of about 10 microns. The small air gap produced by pressurized first and second in-vacuum air bearing assemblies 602, 604 creates a surface averaging effect along an outer surface of hollow shaft wall 664, parallel to a longitudinal axis 618 of hollow shaft 612, which allows object stage 606 to stably move along hollow shaft 612. In some embodiments, object stage 606 can include an object stage housing 608.

In some embodiments, maintenance supply line 646 includes at least one electrical cable and/or hose needed for object stage applications (e.g., movement, calibration, feedback, control, etc.) and supplies the necessary pressure, cooling, and/or power (e.g., vacuum, ambient gas, pressurized gas, water, electrical power, electrical signals, etc.). Maintenance supply line 646 is configured to supply pressurized gas, for example, air, to air bearings 620, 622 of first in-vacuum air bearing assembly 602 and to air bearings 624, 626 of second in-vacuum air bearing assembly 604. In some embodiments, the pressurized gas supplied by maintenance supply line 646 can be an inert gas (e.g., argon, nitrogen, helium) and/or a gas substantially purified of any contaminants.

First in-vacuum air bearing assembly 602 delivers pressurized gas (e.g., air) from maintenance supply line 646 to air bearings 620, 622 via air bearing lines 650, 648, respectively. Maintenance supply line 646 is ported down hollow shaft 612 and through first hollow shaft aperture 614 into stage chamber 610. The pressurized air bearings 620, 622 create an air gap, for example, of about 10 microns between external shaft wall 664 and the adjacent interior surface of first in-vacuum air bearing assembly 602. First in-vacuum air bearing assembly 602 can include ambient scavenging grooves 628, 630 that siphon out the pressurized gas expelled from air bearings 620, 622, respectively. The pressure of the gas flow into air bearings 620, 622, for example, about $6\times10^5$ Pa, is greater than the pressure of gas flow into ambient scavenging grooves 628, 630, for example, about $1\times10^5$ Pa, which maintains stable levitation. Ambient scavenging grooves 628, 630 can be fluidly connected to maintenance supply line 646 via ambient scavenging groove lines 656, 658, respectively. Further, first in-vacuum air bearing assembly 602 is configured to maintain a vacuum from vacuum pump line 644 in vacuum scavenging grooves 636, 638.

Vacuum scavenging grooves 636, 638 are configured to reduce any remaining particle contamination from pressurized air bearings 620, 622 not already isolated by ambient scavenging grooves 628, 630. Ambient scavenging grooves 628, 630 surround air bearings 620, 622, respectively, on both axial sides, and vacuum scavenging grooves 636, 638 are external to ambient scavenging grooves 628, 630 and located at a distal end of first in-vacuum air bearing assembly 602 away from object stage 606. These additional negative pressure vacuum scavenging grooves 636, 638 (for example, at about 600 Pa) along with ambient scavenging grooves 628, 630, help ensure that any particle contamination produced or introduced within stage chamber 610 defined by housing 608 is contained within housing 608 and does not escape. Hollow shaft 612, first hollow shaft aperture 614, stage chamber 610, and vacuum scavenging grooves 636, 638 are all maintained under vacuum via vacuum pump line 644. Air bearings 620, 622, ambient scavenging grooves 628, 630, and vacuum scavenging grooves 636, 638 are each isolated by first in-vacuum air bearing assembly walls 666.

Second in-vacuum air bearing assembly 604 delivers pressurized gas (e.g., air) from maintenance supply line 646 to air bearings 624, 626 via air bearing lines 652, 654, respectively. Maintenance supply line 646 is ported down hollow shaft 612 and through second hollow shaft aperture 616 into stage chamber 610. The pressurized air bearings 624, 626 create an air gap, for example, of about 10 microns, between external shaft wall 664 and the adjacent interior surface of second in-vacuum air bearing assembly 604. The pressurized gas expelled from air bearings 624, 626 is siphoned out and away from each air bearing 624, 626 via ambient scavenging grooves 632, 634, respectively. Second in-vacuum air bearing assembly 604 can include ambient scavenging grooves 632, 634 that siphon out the pressurized gas expelled from air bearings 624, 626, respectively. The pressure of the gas flow into air bearings 624, 626, for example, about $6\times10^5$ Pa, is greater than the pressure of the gas flow into ambient scavenging grooves 632, 634, for example, about $1\times10^5$ Pa, which maintains stable levitation. Ambient scavenging grooves 632, 634 can be fluidly connected to maintenance supply line 646 via ambient scavenging groove lines 660, 662, respectively. Further, second in-vacuum air bearing assembly 604 is configured to maintain a vacuum from vacuum pump line 644 in vacuum scavenging grooves 640, 642.

Vacuum scavenging grooves 640, 642 are configured to reduce any remaining particle contamination from pressurized air bearings 624, 626 not already isolated by ambient scavenging grooves 632, 634. Ambient scavenging grooves 632, 634 surround air bearings 624, 626, respectively, on both axial sides, and vacuum scavenging grooves 640, 642 are external to ambient scavenging grooves 632, 634 and located at a distal end of second in-vacuum air bearing assembly 604 away from object stage 606. These additional negative pressure vacuum scavenging grooves 640, 642 (for example, at about 600 Pa) along with ambient scavenging grooves 632, 634, help ensure any particle contamination produced or introduced within stage chamber 610 defined by housing 608 is contained within housing 608 and does not escape. Hollow shaft 612, second hollow shaft aperture 616, stage chamber 610, and vacuum scavenging grooves 640, 642 are all maintained under vacuum via vacuum pump line 644. Air bearings 624, 626, ambient scavenging grooves 632, 634, and vacuum scavenging grooves 640, 642 are each isolated by second in-vacuum air bearing assembly walls 668.

Figure 7:
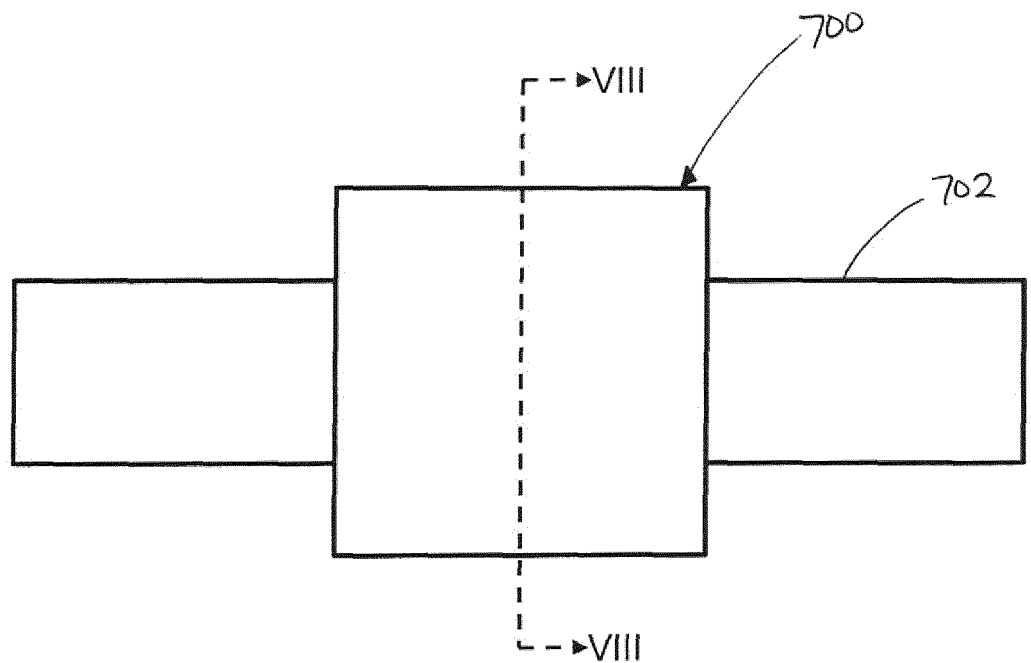
FIG. 7 schematically depicts a radial in-vacuum air bearing, according to an embodiment.
Figure 8:
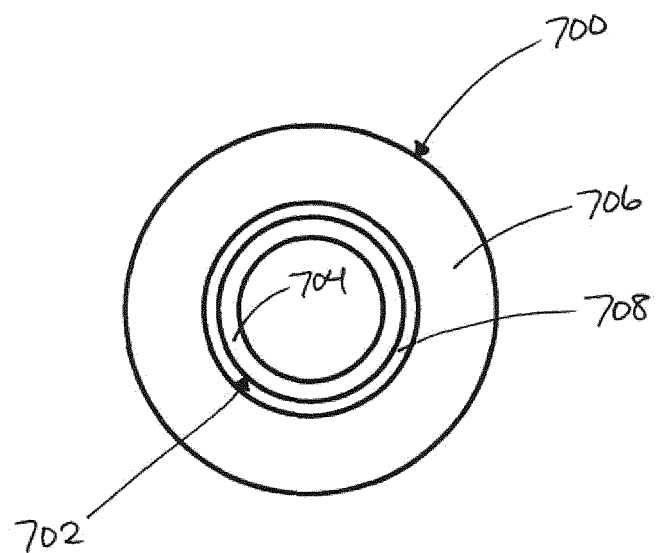
FIG. 8 schematically depicts a cross-section of the radial in-vacuum air bearing assembly of FIG. 7.

FIGS. 7 and 8 schematically depict one embodiment of a radial in-vacuum air bearing assembly 700. Radial in-vacuum air bearing assembly 700 is similar to in-vacuum air bearing assemblies described above in FIGS. 4 through 6, and surrounds a radial hollow shaft 702. FIG. 8 schematically depicts a cross-section of radial in-vacuum air bearing assembly 700 of FIG. 7. Radial in-vacuum air bearing assembly 700 includes a radial in-vacuum air bearing assembly wall 706 and a radial air bearing 707 (not shown), and is separated from radial hollow shaft 702 with radial hollow shaft wall 704 by a radial air gap 708. In some embodiments, radial air gap 708 is about 10 microns in height.

FIGS. 9 through 12 schematically depict one embodiment of rectangular in-vacuum air bearing assembly 900. Rectangular in-vacuum air bearing assembly 900 is similar to in-vacuum air bearing assemblies described above in FIGS. 4 through 8, but rectangular in-vacuum air bearing assembly 900 has a rectangular cross-section. Rectangular in-vacuum air bearing assembly 900 includes a rectangular in-vacuum air bearing assembly wall 906 and is separated from a rectangular hollow shaft 902 with a rectangular hollow shaft wall 904 by a rectangular air gap 908. In some embodiments, rectangular air gap 908 is about 10 microns. Rectangular in-vacuum air bearing assembly 900 replaces the radial in-vacuum air bearing assemblies of FIGS. 4 through 8 with four flat air bearings, as described below in FIGS. 10 and 11.

Figure 9:
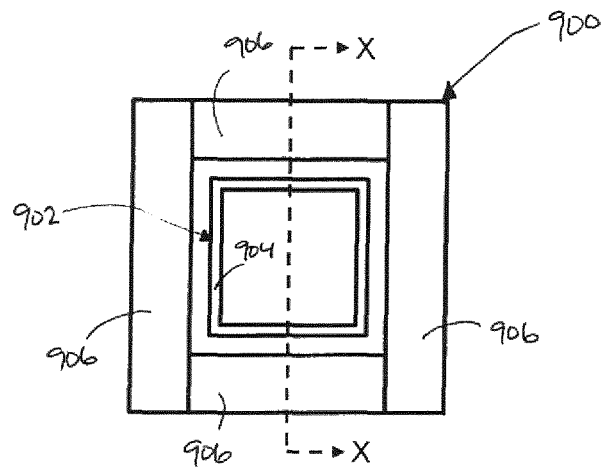
FIG. 9 schematically depicts a rectangular in-vacuum air bearing, according to an embodiment.
Figure 10:
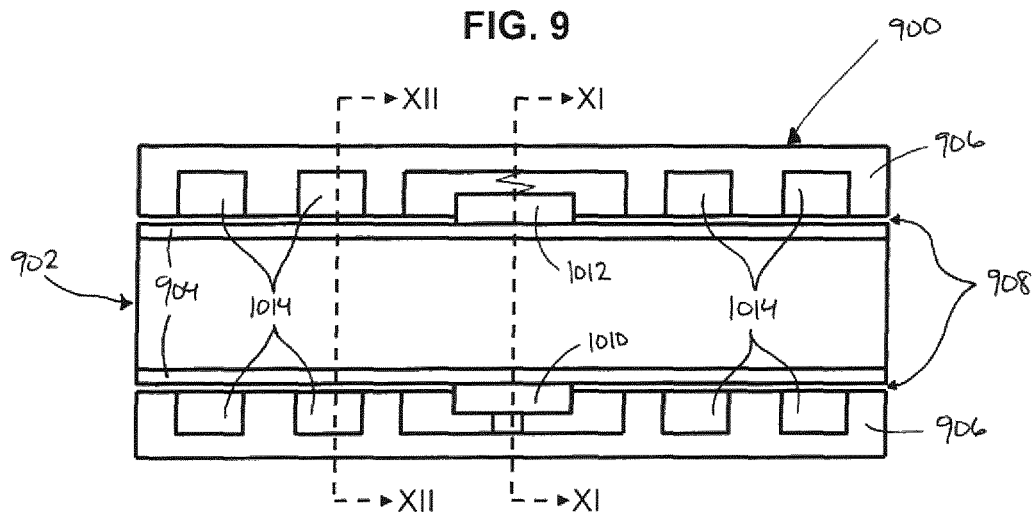
FIG. 10 schematically depicts a cross-section of the rectangular in-vacuum air bearing assembly of FIG. 9.

FIG. 10 schematically depicts a cross-section of rectangular in-vacuum air bearing assembly 900 of FIG. 9. Rectangular in-vacuum air bearing assembly 900 includes rectangular in-vacuum air bearing assembly wall 906, a fixed air bearing 1010, an adjustable air bearing 1012, and a plurality of scavenging grooves 1014. Rectangular in-vacuum air bearing assembly 900 is separated from rectangular hollow shaft 902 with rectangular hollow shaft wall 904 by rectangular air gap 908. In some embodiments, fixed air bearing 1010 is rigidly fixed to rectangular in-vacuum air bearing assembly wall 906, for example, by welding, bonding, or other mechanical securing fixtures. In some embodiments, adjustable air bearing 1012 is mechanically arranged to apply a pressure to external rectangular hollow shaft wall 904, for example, by a pretension spring, hinged support, transducer, actuator, or other mechanical fixtures to apply a pressure.

Figure 11:
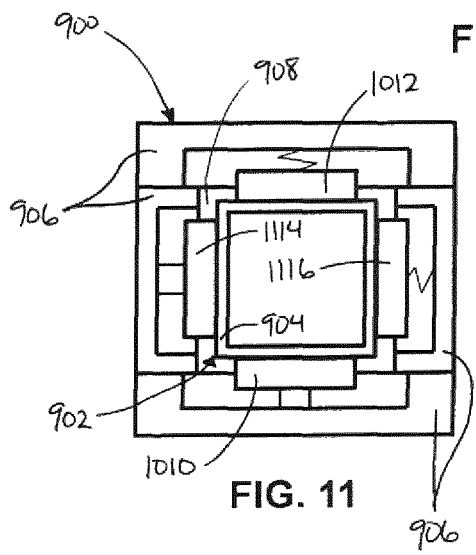
FIG. 11 schematically depicts a cross-section of the air bearings of the rectangular in-vacuum air bearing assembly of FIG. 10.

FIG. 11 schematically depicts a cross-section of air bearings 1010, 1012 of rectangular in-vacuum air bearing assembly 900 of FIG. 10. Rectangular in-vacuum air bearing assembly 900 includes rectangular in-vacuum air bearing assembly wall 906, fixed air bearing 1010, adjustable air bearing 1012, a second fixed air bearing 1114, and a second adjustable air bearing 1116. Rectangular in-vacuum air bearing assembly 900 is separated from rectangular hollow shaft 902 with rectangular hollow shaft wall 904 by rectangular air gap 908. Fixed air bearings 1010, 1114 are orthogonal and fix the corresponding adjustable air bearings 1012, 1116, respectively, to external rectangular in-vacuum air bearing assembly wall 906. In some embodiments, fixed air bearings 1010, 1114 are each rigidly fixed to rectangular in-vacuum air bearing assembly wall 906, for example, by welding, bonding, or other mechanical securing fixtures. In some embodiments, adjustable air bearings 1012, 1116 are each mechanically arranged to apply a pressure to external rectangular in-vacuum air bearing assembly wall 906, for example, by a pretension spring, hinged support, transducer, actuator, or other mechanical fixtures to apply a pressure. Longitudinal air bearing pair 1010, 1012 and transverse air bearing pair 1114, 1116 control drift and tilt away from rectangular hollow shaft 902 in both directions in order to maintain a stable and close rectangular air gap 908.

Figure 12:
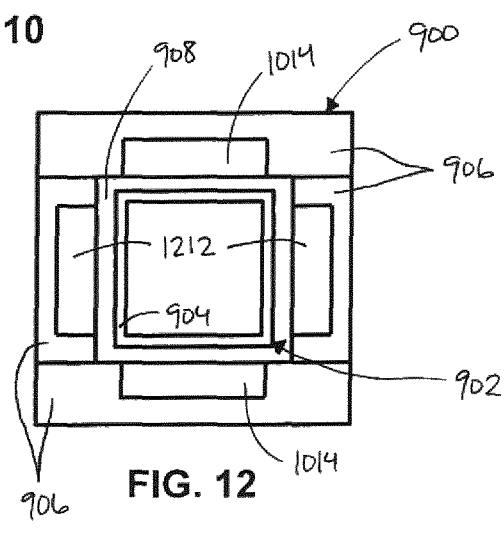
FIG. 12 schematically depicts a cross-section of the scavenging grooves of the rectangular in-vacuum air bearing assembly of FIG. 10.

FIG. 12 schematically depicts a cross-section of scavenging grooves 1014 of rectangular in-vacuum air bearing assembly 900 of FIG. 10. Rectangular in-vacuum air bearing assembly 900 includes rectangular in-vacuum air bearing assembly wall 906, longitudinal scavenging grooves 1014, and transverse scavenging grooves 1212. Rectangular in-vacuum air bearing assembly 900 is separated from rectangular hollow shaft 902 with rectangular hollow shaft wall 904 by rectangular air gap 908. Longitudinal scavenging grooves 1014 are orthogonal to transverse scavenging grooves 1212. Longitudinal and transverse scavenging grooves 1014, 1212 are independent and isolated, and are configured to prevent leakage through corners in the axial direction.

Figure 13:
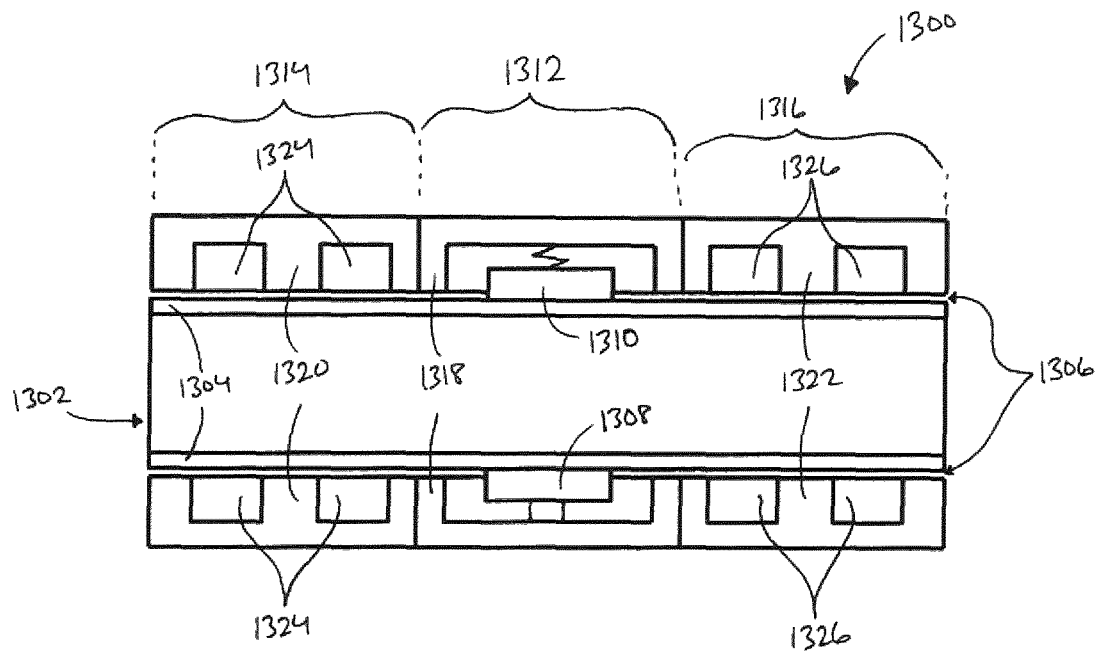
FIG. 13 schematically depicts a cross-section of an in-vacuum air bearing assembly having separate sections for air bearings and scavenging grooves, according to an embodiment.

FIG. 13 schematically depicts a cross-section of one embodiment of a rectangular in-vacuum air bearing assembly 1300 having separate sections for air bearings and scavenging grooves. Rectangular in-vacuum air bearing assembly 1300 is configured to reduce any required manufacturing tolerance by separating an air bearing section 1312 from adjacent first and second scavenging groove sections 1314, 1316. The configuration relaxes the tight mechanical tolerance requirements, allows first and second scavenging groove sections 1314, 1316 to be installed after air bearing section 1312, and allows first and second scavenging grooves section 1314, 1316 to be adjusted with respect to the position of air bearing section 1312.

Rectangular in-vacuum air bearing assembly 1300 includes a rectangular in-vacuum air bearing assembly wall 1318, a fixed air bearing 1308, an adjustable air bearing 1310, and a plurality of scavenging grooves 1324, 1326. Rectangular in-vacuum air bearing assembly 1300 is separated from a rectangular hollow shaft 1302 with a rectangular hollow shaft wall 1304 by a rectangular air gap 1306. In some embodiments, rectangular air gap 1306 is 10 microns. In some embodiments, fixed air bearing 1308 is rigidly fixed to rectangular in-vacuum air bearing assembly wall 1318, for example, by welding, bonding, or other mechanical securing fixtures. In some embodiments, adjustable air bearing 1310 is mechanically arranged to apply a pressure to external rectangular hollow shaft wall 1304, for example, by a pretension spring, hinged support, transducer, actuator, or other mechanical fixtures to apply a pressure. First scavenging groove section 1314 includes a plurality of scavenging grooves 1324 isolated by a plurality of scavenging groove walls 1320. Second scavenging groove section 1316 includes a plurality of scavenging grooves 1326 isolated by a plurality of scavenging groove walls 1322.

Figure 14:
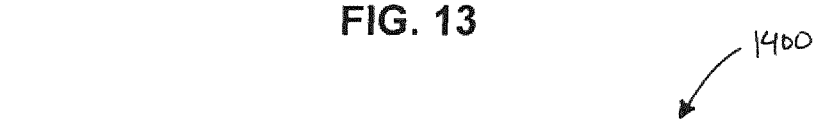
FIG. 14 schematically depicts a cross-section of a rectangular in-vacuum air bearing assembly having a corner scavenging groove, according to an embodiment.

FIG. 14 schematically depicts a cross-section of one embodiment of a rectangular in-vacuum air bearing assembly 1400 having a corner scavenging groove. Rectangular in-vacuum air bearing assembly 1400 is configured to reduce gas leakage through the corners in the axial direction by utilizing corner scavenging grooves 1414 in addition to longitudinal scavenging grooves 1410 and transverse scavenging grooves 1412. Rectangular in-vacuum air bearing assembly 1400 includes a rectangular in-vacuum air bearing assembly wall 1406, longitudinal scavenging grooves 1410, transverse scavenging grooves 1412, and corner scavenging groove 1414. Rectangular in-vacuum air bearing assembly 1400 is separated from a beveled rectangular hollow shaft 1402 with a beveled rectangular hollow shaft wall 1404 by a rectangular air gap 1408. In some embodiments, rectangular air gap 1408 is 10 microns. Longitudinal scavenging grooves 1410, transverse scavenging grooves 1412, and corner scavenging grooves 1414 are independent and isolated, and are configured to prevent leakage through corners in the axial direction.

Figure 15:
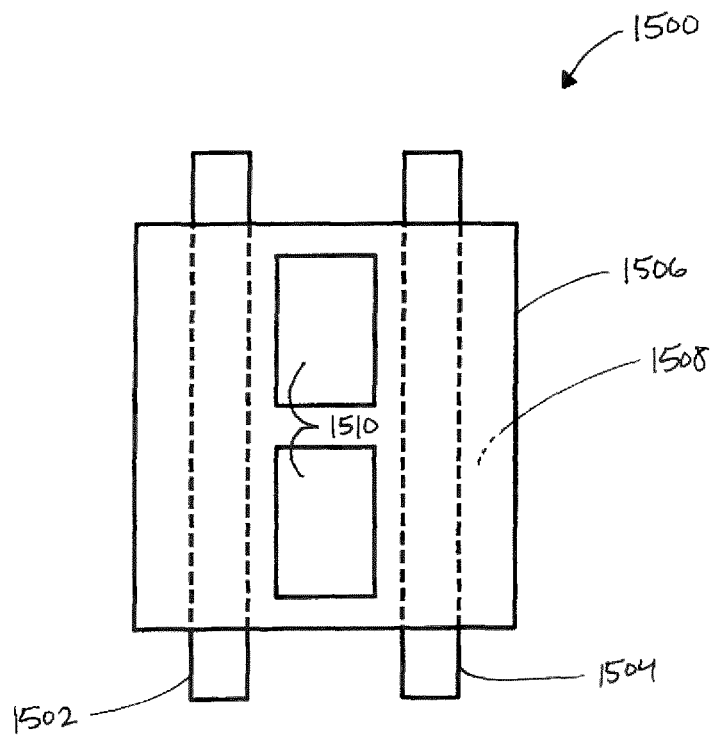
FIG. 15 schematically depicts a top view of an inner cable slab system, according to an embodiment.

FIG. 15 schematically depicts a top view of one embodiment of an inner cable slab system 1500. Inner cable slab system 1500 is configured to house a plurality of inner cable slabs 1510 between first and second hollow shafts 1502, 1504 on a first stage module 1506. In some embodiments, inner cable slabs 1510 are disposed in a stage chamber 1508 disposed in first stage module 1506. In some embodiments, each inner cable slab 1510 is configured to include cable(s) and/or hose(s) needed for first stage module 1506 applications (e.g., movement, calibration, feedback, control, etc.) and to supply the necessary pressure, cooling, and/or power (e.g., vacuum, ambient gas, pressurized gas, water, electrical power, electrical signals, etc.).

Figure 16:
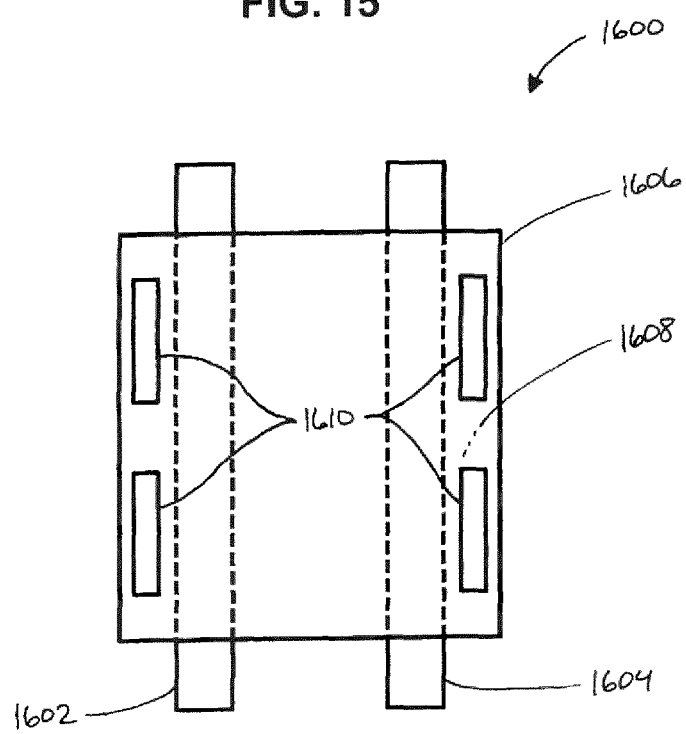
FIG. 16 schematically depicts a top view of an outer cable slab system, according to an embodiment.

FIG. 16 schematically depicts a top view of one embodiment of an outer cable slab system 1600. Outer cable slab system 1600 is configured to house a plurality of outer cable slabs 1610 outside first and second hollow shafts 1602, 1604 on a first stage module 1606. In some embodiments, outer cable slabs 1610 are disposed in a stage chamber 1608 disposed in first stage module 1606. In some embodiments, each outer cable slab 1610 is configured to include cable(s) and/or hose(s) needed for first stage module 1606 applications (e.g., movement, calibration, feedback, control, etc.) and to supply the necessary pressure, cooling, and/or power (e.g., vacuum, ambient gas, pressurized gas, water, electrical power, electrical signals, etc.).

Figure 17:
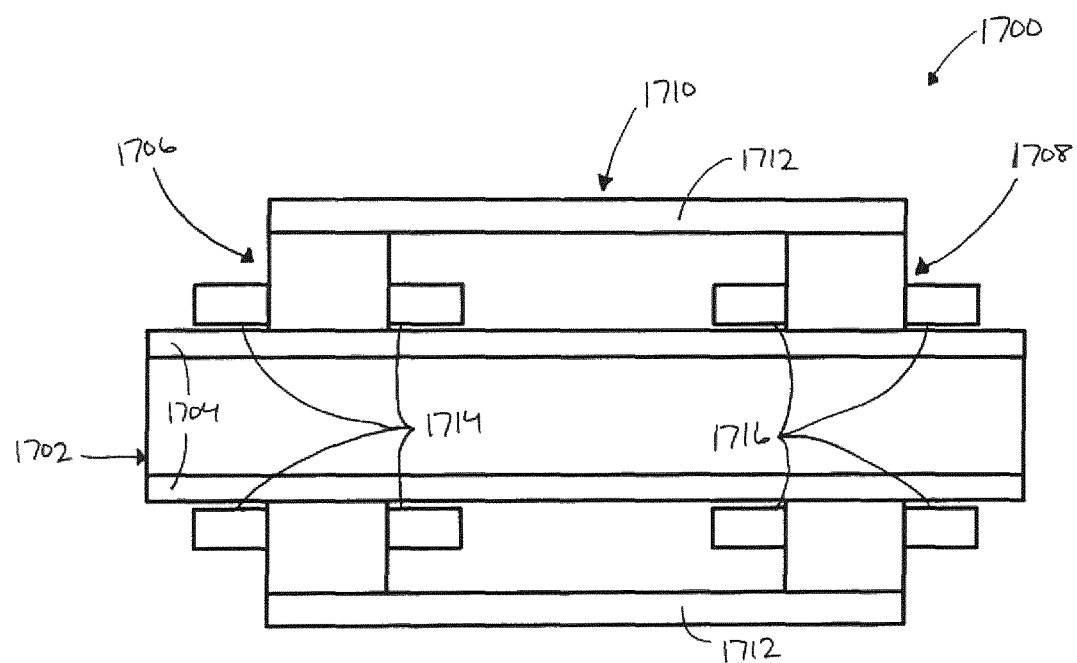
FIG. 17 schematically depicts a cross-section of a linear actuator system, according to an embodiment.

FIG. 17 schematically depicts a cross-section of one embodiment of a linear actuator system 1700. Linear actuator system 1700 is configured to move or adjust a first stage module 1710 with a first stage module housing 1712 along a hollow shaft 1702 with a hollow shaft wall 1704. The movement of first stage module 1710 is controlled by first and second linear actuators 1714, 1716. First linear actuator 1714 is coupled to a first in-vacuum air bearing assembly 1706 and second linear actuator 1716 is coupled to a second in-vacuum air bearing assembly 1708. In some embodiments, first and second linear actuators 1714, 1716 are, for example, linear motors, linear actuators, linear transducers, Lorentz-type actuators, piezoelectric actuators, linear synchronous motors (LSM), reluctance motors, mechanical actuators, hydraulic actuators, pneumatic actuators, electro-mechanical actuators, or any other suitable linear actuators.

Figure 18:
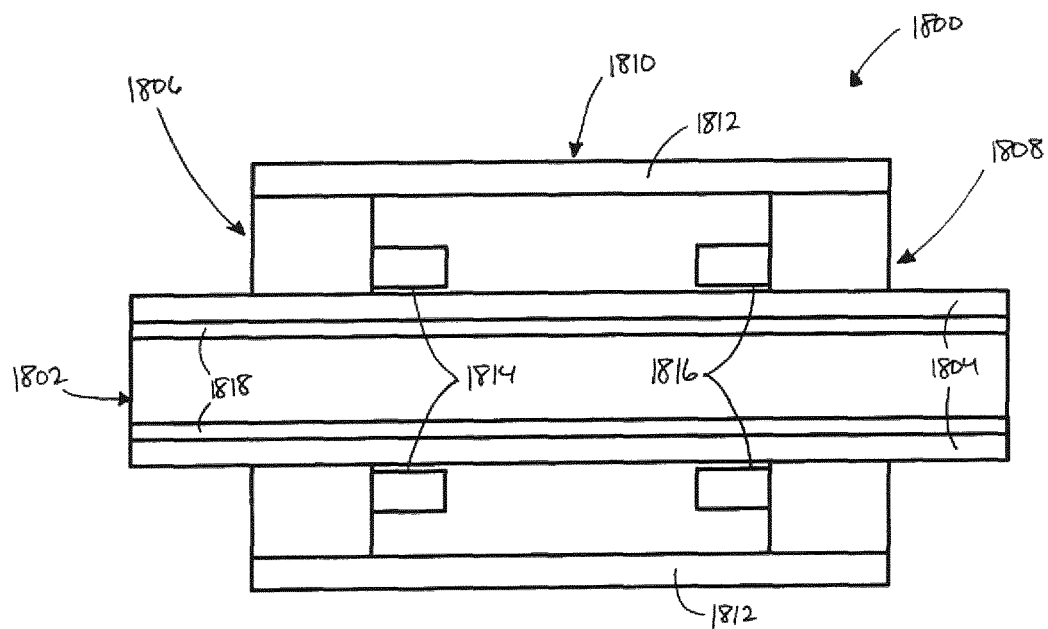
FIG. 18 schematically depicts a cross-section of a magnetic actuator system, according to an embodiment.

FIG. 18 schematically depicts a cross-section of one embodiment of a magnetic actuator system 1800. Magnetic actuator system 1800 is configured to move or adjust a first stage module 1810 with a first stage module housing 1812 along a hollow shaft 1802 with a hollow shaft wall 1804 and a motor coil 1818. The movement of first stage module 1810 is controlled by first and second magnetic actuators 1814, 1816. First magnetic actuator 1814 is coupled to a first in-vacuum air bearing assembly 1806 and second magnetic actuator 1816 is coupled to a second in-vacuum air bearing assembly 1808. In some embodiments, first and second magnetic actuators 1814, 1816 are magnets and motor coil 1818 is stationary. In some embodiments, first and second magnetic actuators 1814, 1816 are permanent magnets and motor coil 1818 is dynamic and is in a moving coil configuration. In some embodiments, first and second magnetic actuators 1814, 1816 are motor coils and motor coil 1818 is a stationary permanent magnet. In some embodiments, first and second magnetic actuators 1814, 1816 are, for example, linear magnetic motors, linear magnetic actuators, linear magnetic transducers, Lorentz-type actuators, piezoelectric actuators, linear synchronous motors (LSM), reluctance motors, mechanical magnetic actuators, electro-mechanical actuators, MEMS magnetic actuator, voice-coil-motor type actuator, electrical coil type actuator, or any other suitable magnetic actuators.

Figure 19:
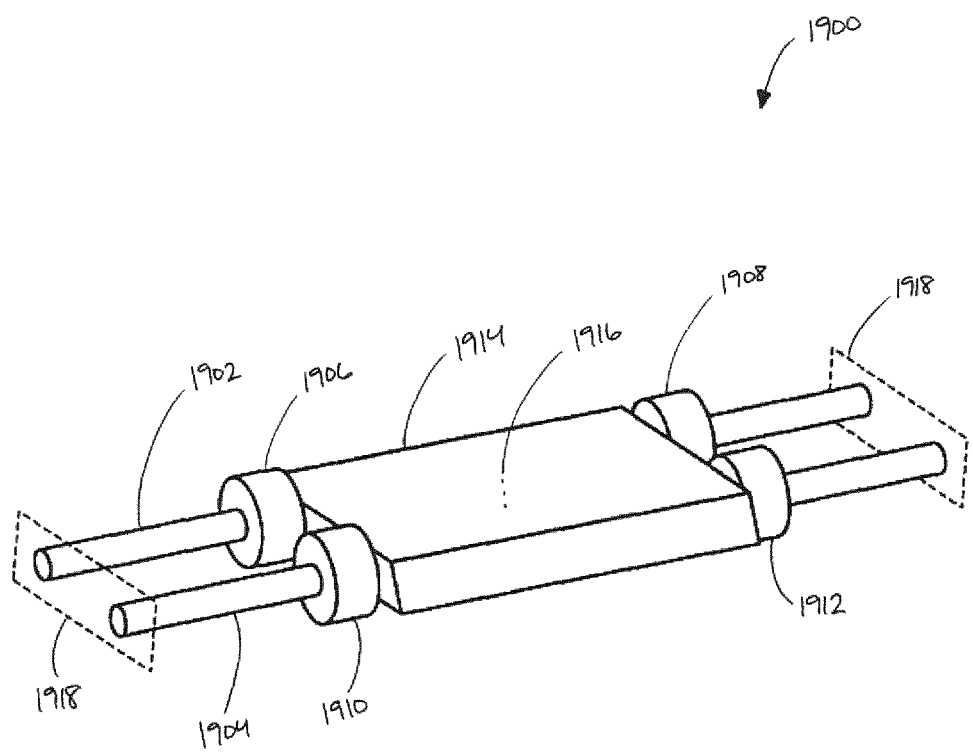
FIG. 19 schematically depicts an object stage bearing system, according to an embodiment.

FIG. 19 schematically depicts, in perspective view, one embodiment of an object stage bearing system 1900. Object stage bearing system 1900 is configured to support and move a single object stage 1914, for example, a long-stroke (LS) stage or a reticle stage along first and second hollow shafts 1902, 1904 via in-vacuum air bearing assemblies 1906, 1908, 1910, 1912, while suppressing particle contamination. Single object stage 1914 comprises first chamber 1916. First chamber 1916 is configured to operate as a moving dirty vacuum chamber between the four in-vacuum air bearing assemblies 1906, 1908, 1910, 1912. First chamber 1916 can host, for example, cable and hose slabs. Further, first chamber 1916 is configured to operate as part of a vacuum channel, which is connected to the in-vacuum air bearing assemblies 1906, 1908, 1910, 1912 and hollow shafts 1902, 1904. In some embodiments, hollow shafts 1902, 1904 can be cylindrical and in-vacuum air bearing assemblies 1906, 1908, 1910, 1912 can be radial, as shown in FIG. 19. In some embodiments, hollow shafts 1902, 1904 and in-vacuum air bearing assemblies 1906, 1908, 1910, 1912 can be cylindrical, rectangular, elliptical, or any other sufficient cross-sectional shape to support single object stage 1914 and reduce particle contamination. Hollow shafts 1902, 1904 support single object stage 1914 and connect to second chamber walls 1918, which enclose object stage bearing system 1900.

The embodiments may further be described using the following clauses:

1. An object stage bearing system comprising:
   an object stage;
   a hollow shaft coupled to the object stage; and
   an in-vacuum gas bearing assembly coupled to the hollow shaft and the object stage, the in-vacuum gas bearing assembly comprising:
   a gas bearing disposed along an inner wall of the in-vacuum gas bearing assembly and disposed along an external wall of the hollow shaft;
   a scavenging groove disposed along the inner wall such that the scavenging groove is isolated from the gas bearing; and
   a vacuum groove disposed along the inner wall such that the vacuum groove is isolated from the scavenging groove and the gas bearing.

2. An object stage bearing system comprising:
   a hollow shaft; and
   an in-vacuum gas bearing assembly comprising:

a gas bearing disposed along an inner wall of the in-vacuum gas bearing assembly and disposed along an external wall of the hollow shaft;

a scavenging groove disposed along the inner wall such that the scavenging groove is isolated from the gas bearing; and a vacuum groove disposed along the inner wall such that the vacuum groove is isolated from the scavenging groove and the gas bearing.

3. An in-vacuum gas bearing assembly comprising:

a gas bearing disposed along an inner wall of the in-vacuum gas bearing assembly;

a scavenging groove disposed along the inner wall such that the scavenging groove is isolated from the gas bearing; and a vacuum groove disposed along the inner wall such that the vacuum groove is isolated from the scavenging groove and the gas bearing.

4. The in-vacuum gas bearing assembly of clause 3, wherein the gas bearing is an air bearing.

5. The in-vacuum gas bearing assembly of clause 3, wherein the scavenging groove surrounds the gas bearing on one axial side.

6. The in-vacuum gas bearing assembly of clause 3, wherein the scavenging groove surrounds the gas bearing on both axial sides.

7. The in-vacuum gas bearing assembly of clause 3, wherein the vacuum groove surrounds the scavenging groove on one axial side.

In some embodiments, object stage bearing system 400, 500, 600, 1900 can achieve active yaw control of first stage module 414, 508, 608, 1914, respectively, by dynamically adjusting the in-vacuum air bearing assemblies to compensate for drift and tilt.

In some embodiments, the injected gas of any of the above described embodiments includes hydrogen ($H_2$). According to some examples, hydrogen can be used both as background gas during EUV exposure and for particular suppressing gas injection in the embodiments of this disclosure. Additionally or alternatively, a gas with heavier molecular or atomic species can be used to increase scattering, cross-section, and momentum transfer. For example, helium (He), nitrogen ($N_2$), Argon (Ar), etc. can be used in the embodiments of this disclosure. In some embodiments, the injected gas is substantially free of any containment particles. However, it is noted that these gases are provided as examples and other gases can also be used in the embodiments of this disclosure. These examples of injected gases (or any combination thereof) may be used in any of above described embodiments. In these embodiments, one or more gas supplies coupled to the gas inlets may supply the gas.

It is noted that although example designs are discussed in this disclosure, the embodiments of this disclosure are not limited to these examples. For example, the embodiments of this disclosure include any combination of the exemplary designs discussed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

It should be understood that relative spatial descriptions between one or more particular features, structures, or characteristics used herein are for purposes of illustration only, and that practical implementations of the structures described herein may include misalignment tolerances without departing from the spirit and scope of the present disclosure.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. An object stage bearing system comprising:
   an object stage configured to move along a hollow shaft;
   the hollow shaft being directly connected to the object stage and comprising:
      an interior channel, and
      a hollow shaft aperture,
      wherein the interior channel is configured to provide one or more supply lines into the object stage through the hollow shaft aperture; and
   an in-vacuum gas bearing assembly directly connected to the hollow shaft and the object stage, the in-vacuum gas bearing assembly comprising:
      a gas bearing disposed along an inner wall of the in-vacuum gas bearing assembly and disposed along an outer wall of the hollow shaft;
      a scavenging groove disposed along the inner wall such that the scavenging groove is isolated from the gas bearing using a first assembly wall of the in-vacuum gas bearing assembly disposed around the gas bearing and along the outer wall of the hollow shaft; and
      a vacuum groove disposed along the inner wall such that the vacuum groove is isolated from the scavenging groove and the gas bearing using a second assembly wall of the in-vacuum gas bearing assembly disposed around the gas bearing and the scavenging groove and along the outer wall of the hollow shaft, wherein the second assembly wall is formed as a separate wall from the first assembly wall, and
   wherein the gas bearing, the scavenging groove, and the vacuum groove extend entirely around a cross-sectional perimeter of the hollow shaft.

2. The object stage bearing system of claim 1, wherein the gas bearing is an air bearing.

3. The object stage bearing system of claim 1, wherein the scavenging groove surrounds the gas bearing on both sides along the longitudinal axis of the hollow shaft.

4. The object stage bearing system of claim 1, wherein the vacuum groove surrounds the scavenging groove on one side along the longitudinal axis of the hollow shaft.

5. The object stage bearing system of claim 1, wherein the scavenging groove is configured to siphon out pressurized gas expelled from the gas bearing.

6. The object stage bearing system of claim 5, wherein a pressure of gas flow into the gas bearing is greater than a pressure of gas flow into the scavenging groove.

7. The object stage bearing system of claim 1, wherein the one or more supply lines include a fluid supply line and an electrical supply line.

8. The object stage bearing system of claim 1, wherein the object stage, the hollow shaft, and the shaft aperture are maintained under a vacuum state.

9. The object stage bearing system of claim 1, wherein the hollow shaft has a cylindrical cross-sectional shape.

10. An object stage bearing system comprising:
    an object stage configured to move along a hollow shaft;
    the hollow shaft including an interior channel configured to provide one or more supply lines into the object stage through an aperture of the hollow shaft;
    an in-vacuum gas bearing assembly directly connected to the hollow shaft and a first lateral side of the object stage, the in-vacuum gas bearing assembly comprising:
       a gas bearing disposed along an inner wall of the in-vacuum gas bearing assembly and disposed along an outer wall of the hollow shaft;
       a scavenging groove disposed along the inner wall such that the scavenging groove is isolated from the gas bearing using a first assembly wall of the in-vacuum gas bearing assembly disposed around the gas bearing and along the outer wall of the hollow shaft; and
       a vacuum groove disposed along the inner wall such that the vacuum groove is isolated from the scavenging groove and the gas bearing using a second assembly wall of the in-vacuum gas bearing assembly disposed around the gas bearing and the scavenging groove and along the outer wall of the hollow shaft, wherein the second assembly wall is formed as a separate wall from the first assembly wall; and
    a second in-vacuum gas bearing assembly opposite the in-vacuum gas bearing assembly along a longitudinal axis of the hollow shaft and directly connected to the hollow shaft and a second lateral side of the object stage,
    wherein the object stage is configured to house one or more supply lines for the gas bearing, and
    wherein the object stage is between the in-vacuum gas bearing assembly and the second in-vacuum gas bearing assembly.

11. The object stage bearing system of claim 10, wherein the gas bearing is an air bearing.

12. The object stage bearing system of claim 10, wherein the scavenging groove surrounds the gas bearing on one side along the longitudinal axis of the hollow shaft.

13. The object stage bearing system of claim 10, wherein the scavenging groove surrounds the gas bearing on both sides along the longitudinal axis of the hollow shaft.

14. The object stage bearing system of claim 10, wherein the vacuum groove surrounds the scavenging groove on one side along the longitudinal axis of the hollow shaft.

15. The object stage bearing system of claim 10, wherein the gas bearing comprises an adjustable gas bearing configured to mechanically adjust a pressure between the in-vacuum gas bearing and the hollow shaft.

16. The object stage bearing system of claim 10, wherein the object stage is configured to operate as a dirty vacuum chamber and comprises one or more slabs configured to store contaminant particle sources.

17. An object stage bearing system comprising:
- a hollow shaft having a longitudinal axis, an interior channel, and an aperture;
- an object stage coupled to the hollow shaft and configured to move along the hollow shaft;
- one or more supply lines housed within the object stage, wherein the interior channel provides the one or more supply lines into the object stage through the aperture of the hollow shaft; and
- an in-vacuum gas bearing assembly coupled to and separate from the hollow shaft and the object stage, the in-vacuum gas bearing assembly comprising:
  - a body;
  - a gas bearing disposed along an inner wall of the body and disposed along an outer wall of the hollow shaft, wherein the gas bearing receives the one or more supply lines;
  - a scavenging groove disposed along the inner wall and within the body such that the scavenging groove is isolated from the gas bearing using a first assembly wall of the body disposed around the gas bearing and along the outer wall of the hollow shaft; and
  - a vacuum groove disposed along the inner wall and within the body such that the vacuum groove is isolated from the scavenging groove and the gas bearing using a second assembly wall of the body disposed around the gas bearing and the scavenging groove and along the outer wall of the hollow shaft, wherein the second assembly wall is separate from the first assembly wall, wherein the scavenging groove surrounds the gas bearing on both sides along the longitudinal axis of the hollow shaft.

18. The object stage bearing system of claim 17, wherein the gas bearing is an air bearing.

19. The object stage bearing system of claim 17, wherein the vacuum groove surrounds the scavenging groove on one side along the longitudinal axis of the hollow shaft.

20. The object stage bearing system of claim 17, wherein the gas bearing, the scavenging groove, and the vacuum groove extend entirely around a cross-sectional perimeter of the hollow shaft.

* * * * *